United States Patent [19]
Utaki et al.

[11] Patent Number: 5,198,395
[45] Date of Patent: Mar. 30, 1993

[54] DIELECTRIC CERAMIC COMPOSITION FOR HIGH FREQUENCY USE

[75] Inventors: Hideki Utaki; Toyomi Nishi; Nobuyoshi Fujikawa, all of Kokubu, Japan

[73] Assignee: Kyocera Corporation, Kyoto, Japan

[21] Appl. No.: 692,131

[22] Filed: Apr. 26, 1991

[30] Foreign Application Priority Data

Apr. 27, 1990 [JP] Japan .................. 2-114123

[51] Int. Cl.⁵ .............................. C04B 35/46
[52] U.S. Cl. ................................... 501/136
[58] Field of Search ............... 501/136, 121, 126

[56] References Cited

U.S. PATENT DOCUMENTS

| | | | |
|---|---|---|---|
| 4,362,637 | 12/1982 | Matsuo et al. ................. | 501/136 X |
| 4,468,471 | 8/1981 | Koshima et al. ............... | 501/136 X |
| 4,670,409 | 6/1987 | Okawa et al. .................. | 501/136 X |
| 5,086,021 | 2/1992 | Sasaki et al. .................. | 501/136 X |

FOREIGN PATENT DOCUMENTS

B25531963 8/1980 Japan .
2249305 10/1987 Japan .

OTHER PUBLICATIONS

Sears, et al, *University Physics* p. 447, 1950.

Primary Examiner—Mark L. Bell
Assistant Examiner—Deborah Jones
Attorney, Agent, or Firm—Spensley Horn Jubas & Lubitz

[57] ABSTRACT

A dielectric ceramic composition having a composition (mole %) expressed by the formula $xMgO \cdot yLa_2O_3 \cdot xTiO_2$ wherein x, y and z are numerals that lie within a range surrounded by a line that couples the points a, b, c, d and e in FIG. 1. The composition can contain 0.01 to 3% by weight of $MnO_2$ with respect to chief components consisting of the above three components. The composition can be effectively used as a resonator or a circuit board in the microwave frequency region.

16 Claims, 1 Drawing Sheet

DIELECTRIC CERAMIC COMPOSITION FOR HIGH FREQUENCY USE

BACKGROUND OF THE INVENTION (1) Field of the Invention

The present invention relates to a novel dielectric ceramic composition adapted to be used as a material of resonators and circuit boards in the microwave frequency band. More specifically, the invention relates to a dielectric ceramic composition which contains MgO, $La_2O_3$ and $TiO_2$ at particular composition ratios.

(2) Description of the Prior Art

In recent years, dielectric ceramics have been extensively used in microwave applications as represented by microwave integrated circuitry, wide-spread use of gun oscillators, and employment of gallium arsenide field-effect transistors for the oscillators, accompanying the trend toward practically using mobile telephones, cordless telephones, personal wireless devices, satellite broadcast receivers, etc.

The dielectric ceramics for microwave applications are chiefly used in the resonators and must satisfy the following three principal characteristics: (1) a large specific inductivity despite a decrease in the size, since the wavelength is contracted to $1/\epsilon r^{\frac{1}{2}}$ in the dielectric, (2) small dielectric loss (large Q value) at high frequencies, and (3) small temperature coefficient of the resonance frequency, i.e., small or stable temperature coefficient of the specific inductivity, $\epsilon r$.

Conventional examples of the dielectric ceramics of this kind include a $BaO$-$TiO_2$ type material, a $BaO$-$REO$-$TiO_2$ (where REO denotes an oxide of a rare earth oxide, the same holds hereinafter) type material, a perovoskite crystal structure in which the site of a metal element in the perovoskite crystal structure is constituted by a plurality of elements, and an $MgTiO_3$-$CaTiO_3$ type material.

The $BaO$-$TiO_2$ type material exhibits a specific inductivity, $\epsilon r$, of as great as 38 to 40 and dielectric loss, tan $\delta$, of as small as $2.0 \times 10^{-4}$ but makes it difficult to obtain a resonance frequency with zero temperature coefficient, Tf, on a single phase. Moreover, the specific inductivity and the temperature dependency of the specific inductivity change greatly with a change in the composition, making it difficult to decrease and stabilize the temperature coefficient, Tf, of resonance frequency while maintaining high specific inductivity and small dielectric loss.

Examples of the $BaO$-$REO$-$TiO_2$ type material may include a $BaO$-$Nd_2O_3$-$TiO_2$ type material or a $BaO$-$Sm2O_3$-$TiO_2$ type material, which can exhibit a specific inductivity, $\epsilon r$, of as very high as 40 to 60; These materials exhibit zero temperature coefficient, Tf, of resonance frequency, though their Q value is smaller than 2000, in other words, their dielectric loss, tan $\delta$, is as great as $5.0 \times 10^{-4}$ or more.

The composite perovskite type material exhibits excellent dielectric characteristics as represented by $Ba(Zn_{\frac{1}{3}}Ta_{\frac{2}{3}})O_3$ but uses such expensive materials as $Nb_2O_5$ and $Ta_2O_5$ in large amounts to drive up the cost of material. Furthermore, the $MgTiO_3$-$CaTiO_3$ type material exhibits the Q value which is greater than 5000 and the temperature coefficient, Tf, of resonance frequency which is zero, but exhibits the specific inductivity which is as small as 16 to 25.

As described above, none of the above-mentioned materials fully satisfy the above three characteristics that are required for the dielectric material for high-frequency applications.

SUMMARY OF THE INVENTION

The present invention is to solve the above-mentioned problems and to provide a dielectric ceramic composition for microwave applications having a suitable specific inductivity, a large Q value and small temperature coefficient of resonance frequency. Concretely speaking, the invention provides a dielectric ceramic composition having a specific inductivity of greater than 22, a Q value of greater than 1000, and Tf of not greater than $\pm 170$ ppm/°C.

The present inventors have forwarded the study in connection with the above-mentioned respects and have found that the above object can be achieved if the composition consists of MgO, $La_2O_3$ and $TiO_2$ at ratios that lie within a predetermined range, and if $MnO_2$ is further added to this composition.

According to the present invention, there is provided a dielectric ceramic composition expressed by the formula which based on oxides of three components as references, $$xMgO \cdot yLa_2O_3 \cdot zTiO_2 \quad (A)$$

wherein x, y and z are numerals which represent said components in mole % and which further satisfy, $$x+y+z=100 \quad (1)$$

$$y \leq -0.79487x + 28.718 \quad (2)$$

$$y \leq -0.26667x + 20.267 \quad (3)$$

$$y \leq 11x + 9 \quad (4)$$

$$y \leq -0.51852x + 14.759 \quad (5)$$

$$\text{and } y \leq 0.5 \quad (6)$$

According to the present invention, there is also provided a dielectric ceramic composition which contains 0.01 to 3% by weight of $MnO_2$ with respect to the chief components expressed by the above formula (A).

DETAILED DESCRIPTION OF THE PREFERRED EMBODIMENT

Figure 1:
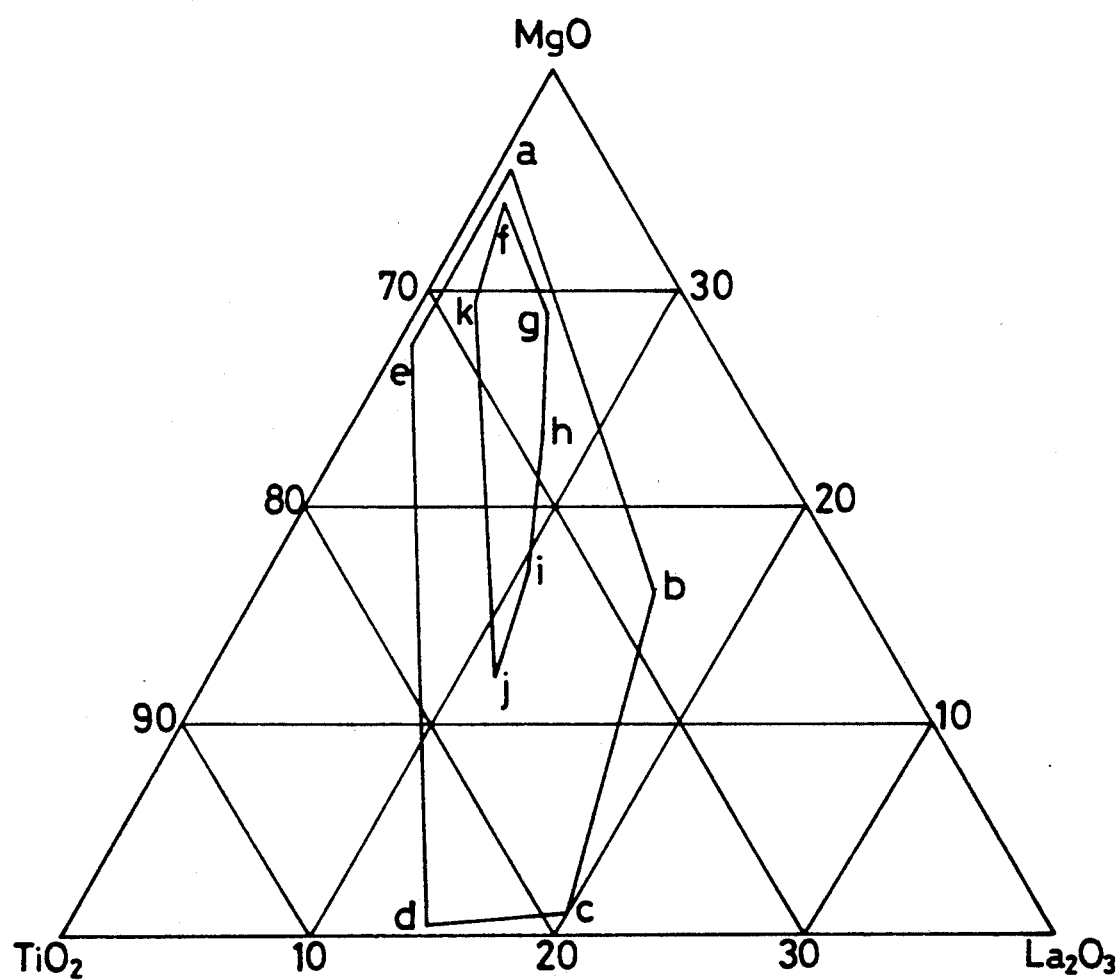
FIG. 1 is a three-way diagram of the $MgO$-$La_2O_3$-$TiO_2$ system explaining the composition range of a dielectric ceramic composition of the present invention.

The composition of the present invention lies within a region surrounded by a line that connects the points a, b, c, d and e in this order in the diagram of ternary system $MgO$-$La_2O_2$-$TiO_2$ of FIG. 1, and wherein the compositions at each of the points are expressed as follows:

|   | x    | y    | z    |
|---|------|------|------|
| a | 35.5 | 0.5  | 64.0 |
| b | 16.0 | 16.0 | 68.0 |
| c | 1.0  | 20.0 | 79.0 |
| d | 0.5  | 14.5 | 85.0 |
| e | 27.5 | 0.5  | 72.0 |

From these coordinate values, the composition ratios of the present invention are expressed by the above inequalities (1) to (6). The equality (2) corresponds to a straight line a-b, (3) corresponds to a straight line b-c, (4) corresponds to a straight line c-d, (5) corresponds to a straight line d-e, and (6) corresponds to a straight line e-a.

As described above, the dielectric ceramic composition of the present invention is composed of MgO, $La_2O_3$ and $TiO_2$ as chief components. The reason why the composition is limited to lie within the above-mentioned ranges is because the Q value becomes smaller than 1000 when $TiO_2$ becomes smaller than a line connecting the points a-b-c, the composition is poorly sintered when MgO becomes smaller than a line connecting the points c-d, Tf becomes greater than 170 ppm/°C. when $TiO_2$ becomes greater than a line connecting the points d-e, and the composition is poorly sintered when $La_2O_3$ becomes smaller than a line connecting the points e-a.

More excellent properties are exhibited if the composition of the present invention is limited to lie within a range surrounded by points f-g-h-i-j-k-f in the three-way diagram of FIG. 1. The region surrounded by these lines are expressed by the following equations, $$fg: y \leq -0.8302x + 29.2268 \quad (7)$$

$$gh: y \leq -0.4717x + 19.9378 \quad (8)$$

$$hi: y \leq -0.3871x + 16.9581 \quad (9)$$

$$ij: y \leq -0.24x + 14.428 \quad (10)$$

$$jk: y \leq -0.5429x + 18.1234 \quad (11)$$

and $$kf: y \leq -0.2326x + 8.9082 \quad (12)$$

It is also possible to further increase the Q value of the composition by adding $MnO_2$ to the $MgO-La_2O_3-TiO_2$. However, this effect is not obtained if the amount of $MnO_2$ is smaller than 0.01% by weight, and the dielectric constant decreases if the amount of $MnO_2$ exceeds 3.0% by weight. It is desired that $MnO_2$ is added in an amount of 0.1 to 1.0% by weight.

To produce the ceramic according to the present invention, powders of metal oxides constituting the ceramic, i.e., powders of MgO, $La_2O_3$, $TiO_2$ and $MnO_2$, are weighed and mixed together, or compounds such as carbonate, nitrate and sulfate that are capable of forming oxides upon baking, are weighed and mixed together, and are then calcined at 950° to 1150° C. as required. Then, the mixed powder or the calcined powder can be molded by a customary molding method and fired at a temperature of 1250° to 1400° C. in air.

In the thus obtained dielectric ceramic are formed crystals that contain at least one phase among the five crystalline phases of $TiO_2$, $La_4Ti_9O_{24}$, $MgTiO_2O_5$, $La_{0.66}TiO_{2.993}$ and $La_2Ti_2O_7$. Among these crystalline phases, it is desired that $La_4Ti_9O_{24}$, $MgTi_2O_5$ or $La_{0.66}TiO_{2.993}$ exists as a main crystalline phase, and it is particularly desired that both $La_4Ti_9O_{24}$ and $MgTi_2O_5$ exist together to constitute the main crystalline phase.

The dielectric ceramic composition of the present invention of the type of $MgO-La_2O_3-TiO_2$ exhibits dielectric characteristics of small Tf and large Q value at high-frequency regions as a result of limiting the composition within a particular range. The specific inductivity and Tf can, further, be freely changed by changing the composition ratio of the three components within the above range.

The distinguished feature of the dielectric ceramic composition of the present invention is that it exhibits a dielectric constant (εr) of greater than 22 and, particularly, from 22 to 33, a Q value of greater than 1000 and, particularly, from 2000 to 7000, and Tf of −170 ppm/°C. to +170 ppm/°C. and, particularly −30 ppm/°C. to +30 ppm/°C.

Therefore, the dielectric ceramic composition of the present invention can be sufficiently used as a material for resonators and circuit boards in high-frequency bands such as microwave frequency bands.

The dielectric ceramic composition of the present invention can be applied to resonators, substrates and the like which are used mainly in a microwave band.

Specifically, these resonators can select a given signal by being resonated at only a given frequency. The resonators may include, for example, a dielectric resonator comprising a rod element formed of an dielectric material and supported within a metallic container, which is operated in a TE (01δ) mode (transverse electric mode), a coaxial resonator comprising a rod element having a cavity therein and formed with electrodes on the inner and outer peripheries thereof, which is operated in a TEM mode (transverse electric magnetic mode) and a strip line resonator comprising a rectangular parallelepipedon, a grounded electrode formed over the entire of one side and a strip line having a given shape formed in the opposite side, which is operated in a TEM mode (transverse electric magnetic mode).

The electrodes and lines used in the resonators may be formed by coating the element with an electrically conductive paste such as Au, Ag, Cu, Al, Ni, Cr, Pt and Pd on the surface thereof and baking the paste thereon, or simultaneously calcinating the paste together with ceramics, or thin film forming techniques such as plating and PVD method.

EMBODIMENTS

The invention will now be described by way of embodiments.

Embodiment 1

Powders of starting materials consisting of MgO, $La_2O_3$, $TiO_2$ and were weighed at ratios of Table 1, and were mixed together for 20 hours using a ball mill while adding pure water thereto. The slurry was dried and calcined at 1100° C. for two hours. The calcined mixed powder was pulverized again using the ball mill for 20 hours, and the slurry thereof was dried. The obtained dry powder was admixed with about 1% by weight of a binder, molded under a pressure of about 1 ton/cm², and was fired at 1200° to 1250° C. for two hours in air to obtain rod samples about 14 mm in diameter x 7 mm in thickness.

The samples were measured for their specific inductivity εr, Q value and Tf at a resonance frequency (f) of 3.5 to 6.0 GHz in compliance with the dielectric cylindrical resonator method. The Q values were converted into those of at 5 GHz based upon $Q \times f = $ constant. The temperature coefficients Tf were measured over a range of −40° to +85° C. and were calculated with the resonance frequency at 25° C. as a reference.

The results were as shown in Table 1.

TABLE 1

| Sample No. | Composition (mole %) MgO | La$_2$O$_3$ | TiO$_2$ | Dielectric constant εr | Q value | Tf (ppm/°C.) −40° C. | +85° C. |
|---|---|---|---|---|---|---|---|
| a1 | 35.5 | 0.5 | 64.0 | 22.5 | 8500 | −37.0 | −39.5 |
| f2 | 34.0 | 1.0 | 65.0 | 23.4 | 4930 | −20.0 | −23.5 |
| *3 | 26.2 | 8.8 | 65.0 | 32.7 | 300 | +11.7 | +5.2 |
| *4 | 17.5 | 17.5 | 65.0 | 37.1 | 80 | not measured | |
| *5 | 8.8 | 26.2 | 65.0 | 43.2 | 70 | not measured | |
| 6 | 31.9 | 2.2 | 65.9 | 24.7 | 7110 | −21.0 | −24.0 |
| 7 | 30.9 | 3.2 | 65.9 | 25.5 | 5870 | −12.0 | −13.1 |
| g8 | 28.7 | 5.4 | 65.9 | 31.3 | 4780 | +26.1 | +23.8 |
| *9 | 33.3 | — | 66.7 | poorly sintered | | | |
| 10 | 25.0 | 8.3 | 66.7 | 41.0 | 3960 | +71.5 | +68.9 |
| 11 | 29.0 | 4.1 | 66.9 | 27.0 | 5110 | −8.5 | −8.3 |
| 12 | 27.2 | 5.0 | 67.8 | 27.6 | 4250 | −3.0 | −3.5 |
| 13 | 26.2 | 6.0 | 67.8 | 31.1 | 4030 | +21.0 | +22.5 |
| b14 | 16.0 | 16.0 | 68.0 | 53.1 | 1010 | +103.4 | +102.1 |
| k15 | 29.7 | 2.0 | 68.3 | 27.6 | 4220 | +27.5 | +20.2 |
| 16 | 26.4 | 4.9 | 68.7 | 27.0 | 6070 | −9.1 | −10.6 |
| 17 | 25.4 | 5.9 | 68.7 | 28.3 | 4100 | −1.7 | −0.9 |
| 18 | 24.4 | 6.9 | 68.7 | 31.7 | 4360 | +17.3 | +16.8 |
| h19 | 23.4 | 7.9 | 68.7 | 33.1 | 3570 | +28.0 | +27.5 |
| 20 | 21.5 | 9.8 | 68.7 | 40.3 | 4350 | +60.0 | +58.2 |
| 21 | 19.5 | 11.8 | 68.7 | 44.7 | 3420 | +76.3 | +77.2 |
| 22 | 24.6 | 5.7 | 69.7 | 26.6 | 4090 | −6.3 | −6.8 |
| 23 | 23.7 | 6.6 | 69.7 | 28.9 | 4190 | −0.1 | −0.8 |
| 24 | 25.3 | 4.4 | 70.3 | 28.3 | 4700 | +28.2 | +21.7 |
| 25 | 22.0 | 7.4 | 70.6 | 29.5 | 4330 | +0.2 | +1.4 |
| 26 | 20.2 | 9.2 | 70.6 | 32.9 | 3270 | +23.8 | +24.0 |
| 27 | 16.5 | 12.9 | 70.6 | 42.8 | 2930 | +74.5 | +71.1 |
| e28 | 27.5 | 0.5 | 72.0 | 35.8 | 8930 | +158.5 | +130.1 |
| 29 | 24.1 | 3.4 | 72.5 | 32.8 | 4360 | +93.2 | +82.6 |
| 30 | 20.6 | 6.9 | 72.5 | 31.0 | 3550 | +26.1 | +23.2 |
| i31 | 17.2 | 10.3 | 72.5 | 32.7 | 3170 | +20.5 | +21.3 |
| 32 | 13.7 | 13.8 | 72.5 | 43.0 | 2970 | +63.0 | +64.1 |
| 33 | 18.6 | 8.0 | 73.4 | 31.0 | 3720 | +23.5 | +19.9 |
| 34 | 19.2 | 6.4 | 74.4 | 33.7 | 4350 | +65.6 | +50.1 |
| 35 | 16.4 | 9.2 | 74.4 | 32.1 | 3570 | +22.5 | +21.7 |
| 36 | 15.4 | 9.8 | 74.8 | 32.1 | 2770 | +25.2 | +28.3 |
| *37 | 1.0 | 24.0 | 75.0 | 44.1 | 310 | not measured | |
| 38 | 17.8 | 5.9 | 76.3 | 38.1 | 4970 | +115.2 | +105.7 |
| 39 | 15.6 | 8.1 | 76.3 | 35.1 | 4080 | +77.6 | +67.2 |
| j40 | 12.2 | 11.5 | 76.3 | 33.0 | 2700 | +29.3 | +29.7 |
| 41 | 5.9 | 17.8 | 76.3 | 45.6 | 2310 | +70.1 | +74.2 |
| 42 | 7.1 | 14.3 | 78.6 | 34.4 | 2750 | +25.6 | +31.0 |
| c43 | 1.0 | 20.0 | 79.0 | 42.1 | 2100 | +76.2 | +74.5 |
| *44 | 15.0 | 5.0 | 80.0 | 45.8 | 5680 | +212.7 | +184.2 |
| 45 | 10.0 | 10.0 | 80.0 | 40.6 | 4760 | +115.1 | +106.3 |
| 46 | 5.0 | 15.0 | 80.0 | 36.1 | 2430 | 46.7 | 50.6 |
| 47 | 1.3 | 18.7 | 80.0 | 40.6 | 2220 | 57.6 | 62.4 |
| *48 | — | 18.2 | 81.8 | poorly sintered | | | |
| d49 | 0.5 | 14.5 | 85.0 | 43.9 | 3780 | +120.3 | +107.5 |
| *50 | 9.4 | 3.1 | 87.5 | 64.3 | 9250 | +343.7 | +302.7 |
| *51 | 6.2 | 6.3 | 87.5 | 59.7 | 6720 | +285.6 | +255.1 |
| *52 | 1.6 | 10.9 | 87.5 | 53.0 | 4320 | +235.0 | +205.7 |

Samples marked with * are not included in the scope of the present invention.

As will be obvious from the above Table 1, the ceramic having compositions that lie within a range surrounded by the points a-b-c-d-e-a of the present invention all exhibited such dielectric characteristics as specific inductivities of greater than 20, values of greater than 1000 and Tf of within 0±170 ppm.

Furthermore, the compositions that lie within a range surrounded by f-g-h-i-j-k-f of FIG. 1 exhibited excellent dielectric characteristics, i.e., specific inductivities of greater than 22, Q values of greater than 2000 and Tf of within 0±30 ppm.

Embodiment 2

To the composition consisting of 15.5 mole % of MgO, 12 mole % of La$_2$O$_3$ and 72.5 mole % of TiO$_2$ was added MnO$_2$ in amounts as shown in Table 2 in order to evaluate the same characteristics as those of the embodiment 1.

The results were as shown in Table 2.

Embodiment 3

To the samples of Table 1 was added MnO$_2$ in an amount of 0.2% by weight to evaluate the characteristics in the same manner. The results were as shown in Table 3.

TABLE 2

| Sample No. | Amount of MnO$_2$ (% by weight) | Dielectric constant εr | Q value | Tf (ppm/°C.) −40° C. | 85° C. |
|---|---|---|---|---|---|
| 105 | — | 38.7 | 3870 | +51.2 | +53.9 |
| 106 | 0.01 | 38.8 | 3920 | +51.9 | +54.1 |
| 107 | 0.1 | 48.8 | 5890 | +51.1 | +53.9 |
| 108 | 0.2 | 39.2 | 6120 | +50.9 | +53.8 |
| 109 | 1.0 | 38.5 | 5710 | +50.8 | +53.6 |
| 110 | 3.0 | 36.4 | 5340 | +51.7 | +54.7 |
| *111 | 4.0 | 35.2 | 5190 | +51.5 | +54.8 |

Samples marked with * are not included in the scope of the invention.

TABLE 3

| Sample No. | Composition (mole %) MgO | La$_2$O$_3$ | TiO$_2$ | Dielectric constant εr | Q value | Tf (ppm/°C.) −40° C. | +85° C. |
|---|---|---|---|---|---|---|---|
| 53 | 35.5 | 0.5 | 64.0 | 22.2 | 12690 | −35.0 | −38.5 |
| 54 | 34.0 | 1.0 | 65.0 | 23.5 | 7090 | −20.6 | −24.1 |
| *55 | 26.2 | 8.8 | 65.0 | 32.6 | 350 | +11.0 | +4.8 |
| *56 | 17.5 | 17.5 | 65.0 | 37.8 | 90 | not measured | |
| *57 | 8.8 | 26.2 | 65.0 | 43.0 | 80 | not measured | |
| 58 | 31.9 | 2.2 | 65.9 | 24.3 | 12700 | −19.9 | −22.1 |
| 59 | 30.9 | 3.2 | 65.9 | 25.8 | 9610 | −13.2 | −13.4 |
| 60 | 28.7 | 5.4 | 65.9 | 31.9 | 9230 | +28.1 | +25.8 |
| *61 | 33.3 | — | 66.7 | poorly sintered | | | |
| 62 | 25.0 | 8.3 | 66.7 | 40.5 | 7200 | +70.5 | +66.9 |
| 63 | 29.0 | 4.1 | 66.9 | 26.8 | 9340 | −8.0 | −8.4 |
| 64 | 27.2 | 5.0 | 67.8 | 27.6 | 7890 | −3.6 | −3.3 |
| 65 | 26.2 | 6.0 | 67.8 | 31.2 | 7640 | +20.0 | +21.7 |
| 66 | 16.0 | 16.0 | 68.0 | 52.9 | 1450 | +106.5 | +103.3 |
| 67 | 29.7 | 2.0 | 68.3 | 27.1 | 7190 | +29.5 | +20.5 |
| 68 | 26.4 | 4.9 | 68.7 | 26.3 | 9060 | −9.8 | −10.5 |
| 69 | 25.4 | 5.9 | 68.7 | 28.4 | 7790 | −1.1 | −0.6 |
| 70 | 24.4 | 6.9 | 68.7 | 31.2 | 7650 | +16.3 | +16.2 |
| 71 | 23.4 | 7.9 | 68.7 | 33.5 | 6200 | +29.2 | +28.4 |
| 72 | 21.5 | 9.8 | 68.7 | 40.0 | 7040 | +63.0 | +61.2 |
| 73 | 19.5 | 11.8 | 68.7 | 44.0 | 6020 | +78.7 | +77.9 |
| 74 | 24.6 | 5.7 | 69.7 | 26.9 | 7840 | −6.4 | −7.1 |
| 75 | 23.7 | 6.6 | 69.7 | 28.7 | 7580 | −0.2 | +0.7 |
| 76 | 25.3 | 4.4 | 70.3 | 28.4 | 7000 | +26.2 | +19.7 |
| 77 | 22.0 | 7.4 | 70.6 | 29.1 | 6980 | +0.3 | +1.6 |
| 78 | 20.2 | 9.2 | 70.6 | 33.4 | 5400 | +25.0 | +25.8 |
| 79 | 16.5 | 12.9 | 70.6 | 43.4 | 5890 | +72.0 | +71.5 |
| 80 | 27.5 | 0.5 | 72.0 | 36.1 | 15110 | +166.3 | +136.5 |
| 81 | 24.1 | 3.4 | 72.5 | 33.1 | 8580 | +97.8 | +80.7 |
| 82 | 20.6 | 6.9 | 72.5 | 30.3 | 5520 | +27.6 | +23.6 |
| 83 | 17.2 | 10.3 | 72.5 | 33.6 | 5330 | +21.5 | +23.2 |
| 84 | 13.7 | 13.8 | 72.5 | 42.7 | 5030 | +64.0 | +65.4 |
| 85 | 18.6 | 8.0 | 73.4 | 30.5 | 6890 | +21.5 | +19.7 |
| 86 | 19.2 | 6.4 | 74.4 | 33.5 | 8830 | +70.6 | +52.4 |
| 87 | 16.4 | 9.2 | 74.4 | 31.5 | 6360 | +23.1 | +22.7 |
| 88 | 15.4 | 9.8 | 74.8 | 32.1 | 5000 | +27.7 | +29.7 |
| *89 | 1.0 | 24.0 | 75.0 | 43.8 | 420 | not measured | |
| 90 | 17.8 | 5.9 | 76.3 | 37.5 | 8040 | +122.1 | +103.1 |
| 91 | 15.6 | 8.1 | 76.3 | 35.6 | 7160 | +80.7 | +69.5 |
| 92 | 12.2 | 11.5 | 76.3 | 33.0 | 4830 | +31.4 | +32.2 |
| 93 | 5.9 | 17.8 | 76.3 | 46.2 | 4440 | +74.7 | +77.1 |
| 94 | 7.1 | 14.3 | 78.6 | 34.4 | 5400 | +26.1 | +30.6 |
| 95 | 1.0 | 20.0 | 79.0 | 41.5 | 3900 | +74.2 | +73.3 |
| *96 | 15.0 | 5.0 | 80.0 | 45.4 | 9420 | +209.7 | +180.1 |
| 97 | 10.0 | 10.0 | 80.0 | 40.4 | 6610 | +119.1 | +107.8 |
| 98 | 5.0 | 15.0 | 80.0 | 36.6 | 4920 | 48.9 | 50.1 |
| 99 | 1.3 | 18.7 | 80.0 | 40.6 | 4120 | 53.8 | 61.3 |
| *100 | — | 18.2 | 81.8 | poorly sintered | | | |
| 101 | 0.5 | 14.5 | 85.0 | 43.5 | 6360 | +125.9 | +108.2 |
| *102 | 9.4 | 3.1 | 87.5 | 64.3 | 14050 | +354.9 | +306.9 |
| *103 | 6.2 | 6.3 | 87.5 | 59.1 | 10340 | +297.5 | +257.4 |

TABLE 3-continued

| Sample No. | Composition (mole %) | | | Dielectric constant εr | Q value | T f (ppm/°C.) | |
|---|---|---|---|---|---|---|---|
| | MgO | La$_2$O$_3$ | TiO$_2$ | | | −40° C. | +85° C. |
| *104 | 1.6 | 10.9 | 87.5 | 53.2 | 8560 | +229.5 | +204.8 |

Samples marked with * are not included in the scope of the present invention.

From Tables 2 and 3, an increase in the Q value could be confirmed when MnO$_2$ was added in an amount of 0.01% by weight, and the Q value could be nearly doubled when MnO$_2$ was added in an amount of 0.2% by weight compared with when no MnO$_2$ was added. When MnO$_2$ was added in an amount in excess of 4% by weight, however, the dielectric constant dropped conspicuously. Particularly preferably, therefore, MnO$_2$ should be added in an amount of 0.1 to 1% by weight.

Embodiment 4

The samples Nos. 2, 3, 4, 10, 17, 19, 24, 29, 30, 31, 32, 38, 40, 42, 45 and 52 of Table 1 were examined for their crystalline phases by powder X-ray diffraction analysis. The results were as shown in Table 4.

TABLE 4

| Sample No. | TiO$_2$ | MgTi$_2$O$_5$ | La$_4$Ti$_9$O$_{24}$ | La$_{0.66}$TiO$_{2.993}$ | La$_2$Ti$_2$O$_7$ |
|---|---|---|---|---|---|
| 2 | | ○ | | | |
| *3 | | ○ | | ○ | ○ |
| *4 | | ○ | | ○ | ○ |
| 10 | | ○ | | ○ | |
| 17 | | ○ | ○ | | |
| 19 | | ○ | ○ | ○ | |
| 24 | | ○ | ○ | | |
| 29 | ○ | ○ | ○ | | |
| 30 | | ○ | ○ | | |
| 31 | | ○ | ○ | ○ | |
| 32 | | ○ | ○ | ○ | |
| 38 | ○ | ○ | ○ | | |
| 40 | | ○ | ○ | | |
| 42 | | ○ | ○ | | |
| 45 | ○ | ○ | ○ | | |
| *52 | ○ | | ○ | | |

Samples marked with * are not included in the scope of the invention.

It will be understood from Table 4 that the dielectric ceramic constituted according to the present invention assumes a mixed form which includes at least one crystalline phase among five crystalline phases consisting of TiO$_2$, La$_4$Ti$_9$O$_{24}$, MgTi$_2$O$_5$, La$_{0.66}$TiO$_{2.993}$ and La$_2$Ti$_2$O$_7$. There is a tendency that when La$_2$O$_3$ is added in large amounts, La$_2$Ti$_2$O$_7$ is precipitated as a main crystalline phase. This crystal, however, has a small Q value, and the ceramic as a result exhibits not much large Q value. To obtain a high Q value, therefore, the amount of La$_2$O$_3$ is decreased, and La$_4$Ti$_9$O$_{24}$, La$_{0.66}$TiO$_{2.993}$ or MgTi$_2$O$_5$ that exhibits a high Q value by itself is added as a main crystalline phase. Moreover, MgTi$_2$O$_5$ is a crystalline phase having small Tf which is indispensable for the composition system of the present invention to exhibit its characterics. On the other hand, TiO$_2$ causes Tf to increase but presents no problem when it is used in small amounts. TiO$_2$ which is detected in small amounts in the composition of the present invention affects Tf very little.

We claim:

1. A dielectric ceramic comprising a composition expressed by the formula which is based on oxides of three components as references, $$xMgO \cdot yLa_2O_3 \cdot zTiO_2 \quad (A)$$

wherein x, y and z are numerals which represent said components in mole % and which further satisfy the equations, $$x+y+z=100 \quad (1)$$

$$y \leq -0.79487x+28.718 \quad (2)$$

$$y \leq -0.26667x+20.267 \quad (3)$$

$$y \leq 11x+9 \quad (4)$$

$$y \leq -0.51852x+14.759 \quad (5) \text{ and}$$

$$y \leq 0.5 \quad (6).$$

2. A dielectric ceramic composition according to claim 1, wherein x, y and z in said formula (A) are numerals that satisfy the following equations, $$x+y+z=100 \quad (1)$$

$$y \leq -0.8302x+29.2268 \quad (7)$$

$$y \leq -0.4717x+19.9378 \quad (8)$$

$$y \leq -0.3871x+16.9581 \quad (9)$$

$$y \leq -0.24x+14.428 \quad (10)$$

$$y \leq -0.5429x+18.1234 \quad (11) \text{ and}$$

$$y \leq -0.2326x+8.9082 \quad (12).$$

3. A dielectric ceramic composition according to claim 1, wherein said composition further contains as a main crystalline phase at least one compound selected from the group consisting of La$_4$MgTi$_2$O$_5$ and La$_{0.66}$TiO$_{2.993}$.

4. A dielectric ceramic composition according to claim 1, wherein said composition further contains as a main crystalline phase MgTi$_2$O$_5$ and La$_4$Ti$_9$O$_{24}$ in combination.

5. A dielectric ceramic comprising composition containing chief components expressed by the formula which is based on oxides of three components as references, $$xMgO \cdot yLa_2O_3 \cdot zTiO_2 \quad (A)$$

wherein x, y and z are numerals which represent said components in mole % and which further satisfy the equations, $$x+y+z=100 \quad (1)$$

$$y \leq -0.79487x+28.718 \quad (2)$$

$$y \leq -0.26667x+20.267 \quad (3)$$

$$y \leq 11x+9 \quad (4)$$

$$y \leq -0.51852x+14.759 \quad (5)$$

$$\text{and } y \leq 0.5 \quad (6)$$

and 0.01 to 3% by weight of MnO$_2$ with respect to said chief components.

6. A dielectric ceramic composition according to claim 5, wherein x, y and z in said formula (A) are numerals that satisfy the following equations, $$x+y+z=100 \quad (1)$$

$$y \leq -0.8302x + 29.2268 \quad (7)$$

$$y \leq -0.4717x + 19.9378 \quad (8)$$

$$y \leq -0.3871x + 16.9581 \quad (9)$$

$$y \leq -0.24x + 14.428 \quad (10)$$

$$y \leq -0.5429x + 18.1234 \quad (11)$$

$$\text{and } y \leq -0.2326x + 8.9082 \quad (12).$$

7. A dielectric ceramic composition according to claim 5, wherein $MnO_2$ is contained in an amount of 0.1 to 1% by weight with respect to the chief components.

8. A dielectric ceramic composition according to claim 2, wherein said composition further comprises as a main crystalline phase at least one compound selected from the group consisting of $La_4Ti_9O_{24}$, $MgTi_2O_5$ and $La_{0.66}TiO_{2.993}$.

9. A dielectric ceramic composition according to claim 2, wherein said composition further comprises as a main crystalline phase $MgTi_2O_5$ and $La_4Ti_9O_{24}$ in combination.

10. A dielectric ceramic composition according to claim 5, wherein said composition further comprises as a main crystalline phase at least one compound selected from the group consisting of $La_4Ti_9O_{24}$, $MgTi_2O_5$ and $La_{0.66}TiO_{2.993}$.

11. A dielectric ceramic composition according to claim 5 wherein said composition further comprises as a main crystalline phase $MgTi_2O_5$ and $La_4Ti_9O_{24}$ in combination.

12. A dielectric ceramic composition according to claim 6, wherein said composition further comprises as a main crystalline phase at least one compound selected from the group consisting of $La_4Ti_9O_{24}$, $MgTi_2O_5$ and $La_{0.66}TiO_{2.993}$.

13. A dielectric ceramic composition according to claim 6, wherein said composition further comprises as a main crystalline phase $MgTi_2O_5$ and $La_4Ti_9O_{24}$ in combination.

14. A dielectric ceramic composition according to claim 5, wherein $MnO_2$ is present in an amount of 0.01 to 0.49% by weight with respect to the chief components.

15. A dielectric ceramic composition according to claim 6, wherein $MnO_2$ is present in an amount of 0.1 to 1% by weight with respect to the chief components.

16. A dielectric ceramic composition according to claim 6, wherein $MnO_2$ is present in an amount of 0.01 to 0.49% by weight with respect to the chief components.

* * * * *